United States Patent
Sakaguchi

(10) Patent No.: US 8,604,727 B2
(45) Date of Patent: Dec. 10, 2013

(54) POWER STATE DIAGNOSIS METHOD AND APPARATUS

(75) Inventor: Toru Sakaguchi, Gunma (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 13/059,186

(22) PCT Filed: Feb. 4, 2011

(86) PCT No.: PCT/JP2011/052330
§ 371 (c)(1),
(2), (4) Date: Mar. 17, 2011

(87) PCT Pub. No.: WO2012/049861
PCT Pub. Date: Apr. 19, 2012

(65) Prior Publication Data
US 2013/0187574 A1    Jul. 25, 2013

(30) Foreign Application Priority Data
Oct. 15, 2010   (JP) ................................. 2010-232970

(51) Int. Cl.
*H02P 1/00* (2006.01)
*H02P 6/08* (2006.01)
*G01M 17/06* (2006.01)

(52) U.S. Cl.
USPC .......... 318/139; 318/432; 318/400.2; 701/41; 701/42

(58) Field of Classification Search
USPC .......... 318/139, 432, 400.02, 400.09, 400.13; 701/29, 41, 42
See application file for complete search history.

(56) References Cited

U.S. PATENT DOCUMENTS

| | | | | |
|---|---|---|---|---|
| 6,531,872 | B1 * | 3/2003 | Carr et al. | 324/379 |
| 7,224,263 | B2 * | 5/2007 | Maehara | 340/429 |
| 7,337,048 | B2 * | 2/2008 | Tanaka et al. | 701/45 |
| 2004/0099233 | A1 * | 5/2004 | Fujimoto et al. | 123/142.5 R |

(Continued)

FOREIGN PATENT DOCUMENTS

| JP | 2007131076 A | 5/2007 |
|---|---|---|
| JP | 2007223435 A | 9/2007 |

(Continued)

OTHER PUBLICATIONS

International Search Report PCT/JP2011/052330; Mar. 8, 2011.

*Primary Examiner* — Paul Ip
(74) *Attorney, Agent, or Firm* — Sughrue Mion, PLLC

(57) ABSTRACT

[Problem]
An object of the present invention is to provide a power state diagnosis method and a power state diagnosis apparatus that do not need to make a control period fast and also do not need to excessively increase a responsibility, and do not give an uncomfortable feeling to a driver.
[Means for Solving the Problem]
The present invention is a power state diagnosis method that diagnoses a power state of a vehicle which comprises an electrical control system supplied from a power supply and a motor controlled by a vector control method, comprising: starting a diagnosis of said power state at a time that an ignition key is switched from "OFF" to "ON" or at a time that said ignition key is switched from "ON" to "OFF", storing a value obtained by adding an offset to an angle of said motor that is read at a start of said diagnosis as a pseudo-motor-angle, performing said vector control based on said pseudo-motor-angle during said diagnosis, and diagnosing said power state based on a voltage that is supplied to said motor.

17 Claims, 8 Drawing Sheets

(56) References Cited

U.S. PATENT DOCUMENTS

| | | |
|---|---|---|
| 2004/0243288 A1* | 12/2004 | Kito et al. .................. 701/29 |
| 2006/0282565 A1* | 12/2006 | Kumaido et al. .............. 710/41 |
| 2008/0067960 A1* | 3/2008 | Maeda et al. ........... 318/400.02 |
| 2009/0240389 A1* | 9/2009 | Nomura et al. .............. 701/29 |
| 2009/0259419 A1* | 10/2009 | Kasai ....................... 702/63 |
| 2010/0121530 A1* | 5/2010 | Suzuki et al. ................ 701/41 |
| 2011/0066331 A1* | 3/2011 | Yamashita .................. 701/42 |
| 2011/0264326 A1* | 10/2011 | Iwasaki ..................... 701/41 |
| 2012/0203430 A1* | 8/2012 | Shimada et al. .............. 701/41 |
| 2013/0079976 A1* | 3/2013 | Kuroda .................... 701/34.4 |
| 2013/0090809 A1* | 4/2013 | Kuroda ..................... 701/41 |

FOREIGN PATENT DOCUMENTS

| | | |
|---|---|---|
| JP | 2007-283916 A | 11/2007 |
| JP | 2008290524 A | 12/2008 |
| JP | 4243146 B2 | 1/2009 |
| JP | 4270196 B2 | 3/2009 |

\* cited by examiner

PRIOR ART

POWER STATE DIAGNOSIS METHOD AND APPARATUS

CROSS REFERENCE TO RELATED APPLICATIONS

This application is a National Stage of International Application No. PCT/JP2011/052330 filed Feb. 4, 2011, claiming priority based on Japanese Patent Application No. 2010-232970 filed Oct. 15, 2010, the contents of all of which are incorporated herein by reference in their entirety.

TECHNICAL FIELD

The present invention relates to a power state diagnosis method and a power state diagnosis apparatus that diagnose a state of a power supply (a battery) that is supplied to plural electrical control systems provided at a vehicle, and in particular to a power state diagnosis method and a power state diagnosis apparatus that diagnose the state of the power supply that is supplied to an electric power steering apparatus which provides a steering system with an assist force by a motor.

BACKGROUND ART

Heretofore, it is well known that an electric power steering apparatus is one of electrical control systems that are supplied from a battery as a power supply. The electric power steering apparatus drives a motor based on a steering torque inputted by a driver and so on to provide a steering system with an assist force. Usually, since an electricity consumption of such an electric power steering apparatus is considerably high, there is a possibility that the influence of battery degradation is large and it is impossible to obtain a desired assist force when the voltage drops. Therefore, in view of reliability and safety of the electric power steering apparatus, it is necessary to diagnose a state of the battery that is supplied to plural electrical control systems at a beginning time or a shutdown time of driving of the electric power steering apparatus.

An electric power steering apparatus which provides a steering mechanism of a vehicle with a steering assist torque (an assist torque) by means of a rotational torque of a motor, applies a driving force of the motor as the assist torque to a steering shaft or a rack shaft by means of a transmission mechanism such as gears or a belt through a reduction mechanism. In order to accurately generate the assist torque, such a conventional electric power steering apparatus performs a feedback control of a motor current. The feedback control adjusts a voltage supplied to the motor so that a difference between a current command value and the motor current becomes small, and the adjustment of the voltage applied to the motor is generally performed by an adjustment of a duty ratio of a PWM (Pulse Width Modulation) control.

A general configuration of such the electric power steering apparatus will be described with reference to FIG. 1. A column shaft 2 connected to a steering wheel (handle) 1 is connected to tie rods 6 of steered wheels through reduction gears 3, universal joints 4A and 4B, and a rack and pinion mechanism 5. The column shaft 2 is provided with a torque sensor 10 for detecting the steering torque of the steering wheel 1 in accordance with torsion of a torsion bar, and a motor 20 for assisting the steering force of the steering wheel 1 is connected to the column shaft 2 through the reduction gears 3. Electric power is supplied to a control unit 30 for controlling the electric power steering apparatus from a battery 14, and an ignition key signal is inputted into the control unit 100 through an ignition key 11. The control unit 30 calculates a current command value I of an assist command based on a steering torque T detected by the torque sensor 10 and a velocity Vel detected by a velocity sensor 12, and controls a current supplied to the motor 20 based on the calculated current command value I.

The control unit 30 mainly comprises a CPU (or an MPU (Micro Processor Unit) or an MCU (Micro Controller Unit)), and general functions performed by a program within the CPU are shown in FIG. 2 with respect to a vector control method. The vector control is a method that independently sets a q-axis for controlling a torque which is a coordinate system of the rotor magnet and a d-axis for controlling the strength of a magnetic field, and controls currents of the q-axis and the d-axis that have a relation of 90-degree. In general, a three-phase brushless DC motor is used as the motor 20 in the vector control.

The control unit 30 comprises a current command value calculating section 31. The current command value calculating section 31 inputs the steering torque T from the torque sensor 10 and the velocity Vel from the velocity sensor 12, simultaneously inputs a motor angle θ and an angular speed ω that are obtained by converting an output of a resolver 201 provided at the brushless DC motor 20 as a rotation angle sensor by a resolver-to-digital converting circuit (RDC) 202, and calculates a d-axis current command value Idref and a q-axis current command value Iqref by referring to an assist map.

The calculated d-axis current command value Idref and the q-axis current command value Iqref are inputted to a two-phase/three-phase converting section 32, and converted to current command values of three phases Iaref, Ibref and Icref in accordance with the motor angle θ. The converted current command values Iaref, Ibref and Icref are inputted to subtracting sections 33-1, 33-2 and 33-3 respectively, a deviation ΔIa between the current command value Iaref and the motor current Ia obtained by a current detector 37-1, a deviation ΔIb between the current command value Ibref and the motor current Ib obtained by a current detector 37-2, and a deviation ΔIc between the current command value Icref and the motor current Ic obtained by a subtracting section 37-3 are calculated, respectively. These deviations ΔIa, ΔIb and ΔIc are inputted to a current control section 34 such as PI (proportional-integral control), and controlled voltage command values Varef, Vbref and Vcref are outputted. Then, the voltage command values Varef, Vbref and Vcref are inputted to a PWM control section 35. The PWM control section 35 performs a PWM control based on the voltage command values Varef, Vbref and Vcref, and inputs PWM-controlled PWM signals to an inverter circuit 36. The inverter circuit 36 is supplied from the battery 14 as the power supply through a power relay 13, supplies the currents Ia, Ib and Ic to the motor 20 based on the PWM control signals from the PWM control section 35, and performs the vector control with respect to the motor 20 so as to set the deviation ΔIa obtained by the subtracting section 33-1, the deviation ΔIb obtained by the subtracting section 33-2, and the deviation ΔIc obtained by the subtracting section 33-3 as zero, respectively.

With respect to the battery 14 that is supplied to the electrical control systems of such the electric power steering apparatus, in order to normally and stably assist the steering operations of the driver, it is necessary to maintain the power voltage of the battery in a given stable range (for example, 10V-15V). However, failures such as battery degradation (voltage drop) due to various causes, occur. Therefore, before the battery 14 degrades to a degree becoming a hindrance to normal driving of the vehicle, it is necessary to detect the degradation of the battery to inform the driver and prompt charging or exchanging.

In order to solve such a problem, in Patent Document 1 (Japanese Patent No. 4270196 B2), a battery state diagnosis apparatus that is capable of diagnosing a battery status by energizing an electric motor without varying a vehicle status even in a vehicle state control apparatus without plural electric motors by limiting only a d-axis armature current in a dq-axes coordinate system which comprises of a d-axis being an action axis of a magnetic flux created by a permanent magnet of a rotor of a brushless DC motor and a q-axis that is perpendicular to the d-axis to less than or equal to a given upper-limit current value and passing the limited d-axis armature current, and not passing a q-axis armature current, is proposed.

Further, in Patent Document 2 (Japanese Patent No. 4243146 B2), a battery state determining apparatus in an electric power steering apparatus with plural actuators that drives at least one of the plural actuators to steer in a right direction and simultaneously drives other at least one of the plural actuators to steer in a left direction, and controls output torques of actuators that are driven to steer in the left and right directions respectively so that the wheels are not steered, and determines the battery state based on the amount of descent of a terminal voltage outputted from a voltage sensor during driving the above actuators, is proposed.

THE LIST OF PRIOR ART DOCUMENTS

Patent Documents

Patent Document 1: Japanese Patent No. 4270196 B2
Patent Document 2: Japanese Patent No. 4243146 B2

SUMMARY OF THE INVENTION

Problems to be Solved by the Invention

However, in the battery state diagnosis apparatus described in Patent Document 1, since it is necessary to make a control period of current control fast so as not to pass the q-axis current that generates torques, an expensive MCU or an exclusive MCU is necessary. In addition, since the noise suppression effect and the response of the current control are conflicting, if increasing the responsibility, the q-axis current noise generates and the motor torque occurs, and there is a possibility to give an uncomfortable feeling to the driver. In order to avoid giving an uncomfortable feeling to the driver, it is needed a function that detects a timing that the driver is not present and performs the diagnosis. Further, with respect to the battery state determining apparatus described in Patent Document 2, there is a problem that it applies only to a vehicle with plural actuators.

The present invention has been developed in view of the above described circumstances, and an object of the present invention is to provide a power state diagnosis method and a power state diagnosis apparatus that do not need to make a control period fast and also do not need to excessively increase a responsibility, and do not give an uncomfortable feeling to a driver.

Means for Solving the Problems

The present invention relates to a power state diagnosis method that diagnoses a power state of a vehicle which comprises an electrical control system supplied from a power supply and a motor controlled by a vector control method, the above-described object of the present invention is achieved by that comprising: starting a diagnosis of said power state at a time that an ignition key is switched from "OFF" to "ON" or at a time that said ignition key is switched from "ON" to "OFF", storing a value obtained by adding an offset to an angle of said motor that is read at a start of said diagnosis as a pseudo-motor-angle, performing said vector control based on said pseudo-motor-angle during said diagnosis, and diagnosing said power state based on a voltage that is supplied to said motor.

The above-described object of the present invention is more effectively achieved by that said electrical control system is an electric power steering apparatus that drives said motor based on a current command value calculated from at least a steering torque detected by a torque sensor; or before starting said diagnosing, in a case that said steering torque or said motor angle varies due to operations of a driver, said power state is not diagnosed; or in a middle of said diagnosing, in a case that said steering torque or said motor angle varies due to operations of said driver, said diagnosing of said power state is interrupted; or said diagnosing is performed at a time that said ignition key is switched from "OFF" to "ON", said driver is informed about a determination that said power state degrades; or said diagnosing is performed at a time that said ignition key is switched from "ON" to "OFF"; or in a case of determining that said power state degrades, a determination result is stored, when said ignition key is switched from "OFF" to "ON" in a next time, said driver is informed about said determination result; or said motor is a brushless DC motor; or said motor is controlled by an open-loop during said diagnosing.

Further, the above-described object of the present invention is achieved by that a power state diagnosis apparatus that is equipped with a vehicle which comprises a power supply supplied to plural electrical control systems and a motor that is supplied from said power supply and controlled by a vector control method and diagnoses a state of said power supply, comprising: a power state diagnosis start-up determining section for detecting that an ignition key is switched from "OFF" to "ON" and said ignition key is switched from "ON" to "OFF" and starting a state diagnosis of said power supply, a pseudo-motor-angle storage section for storing a value obtained by adding an offset to an angle of said motor at the start of said diagnosis as a pseudo-motor-angle, a switching section for switching said motor angle to said pseudo-motor-angle during said diagnosis, and a power state determining section for diagnosing said state of said power supply based on a voltage that is supplied to said motor.

Moreover, the above-described object of the present invention is more effectively achieved by said electrical control system is an electric power steering apparatus that drives said motor based on a current command value calculated from at least a steering torque detected by a torque sensor; or before starting said diagnosis, in a case that said steering torque or said motor angle varies due to operations of a driver, said state of said power supply is not diagnosed; or in a middle of said diagnosis, in a case that said steering torque or said motor angle varies due to operations of said driver, said state diagnosis of said power supply is interrupted; or said motor is controlled by an open-loop during said diagnosis.

Effects of the Invention

The present invention detects that a driver does not steer at a time that an ignition key is switched from "OFF" to "ON" or at a time that the ignition key is switched from "ON" to "OFF", stores a value obtained by adding an offset to a motor angle that is read at the time as a pseudo-motor-angle, and drives the motor based on the pseudo-motor-angle that is stored during the diagnosis so that it is possible to diagnose the battery state in a state that the motor is fixated (in the present invention, "fixation" means a state that the motor does not rotate). Therefore, the present invention does not give an uncomfortable feeling to the driver.

Further, even in the middle of the diagnosis, in the case that the steering torque or the motor angle varies due to the operation of the driver, since the present invention interrupts the diagnosis and returns to the ordinary control, so the present invention does not give an uncomfortable feeling to the driver.

Moreover, by using the fixed pseudo-motor-angle, the present invention does not need to make the control period fast, use an expensive control unit and excessively increase the responsibility.

MODE FOR CARRYING OUT THE INVENTION

Figure 1:
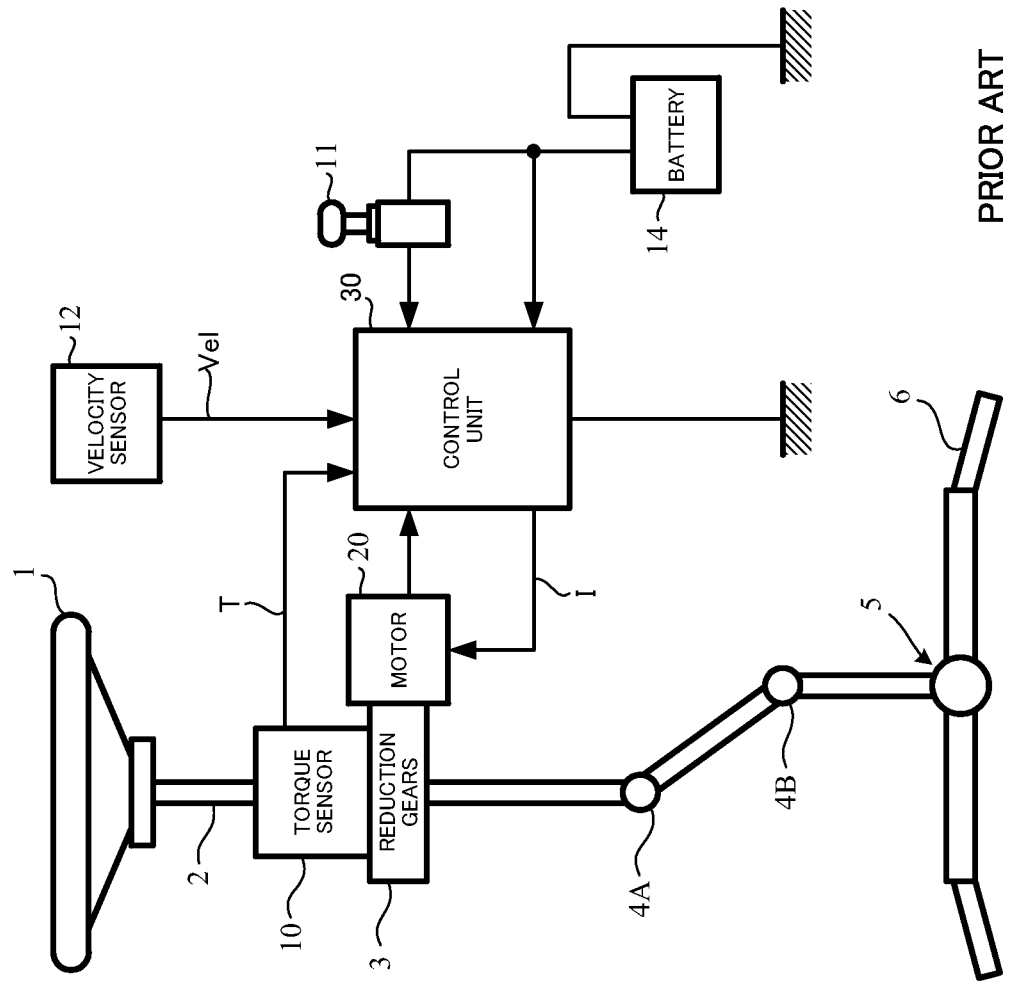
FIG. 1 is a configuration diagram illustrating a schema of an electric power steering apparatus.
Figure 2:
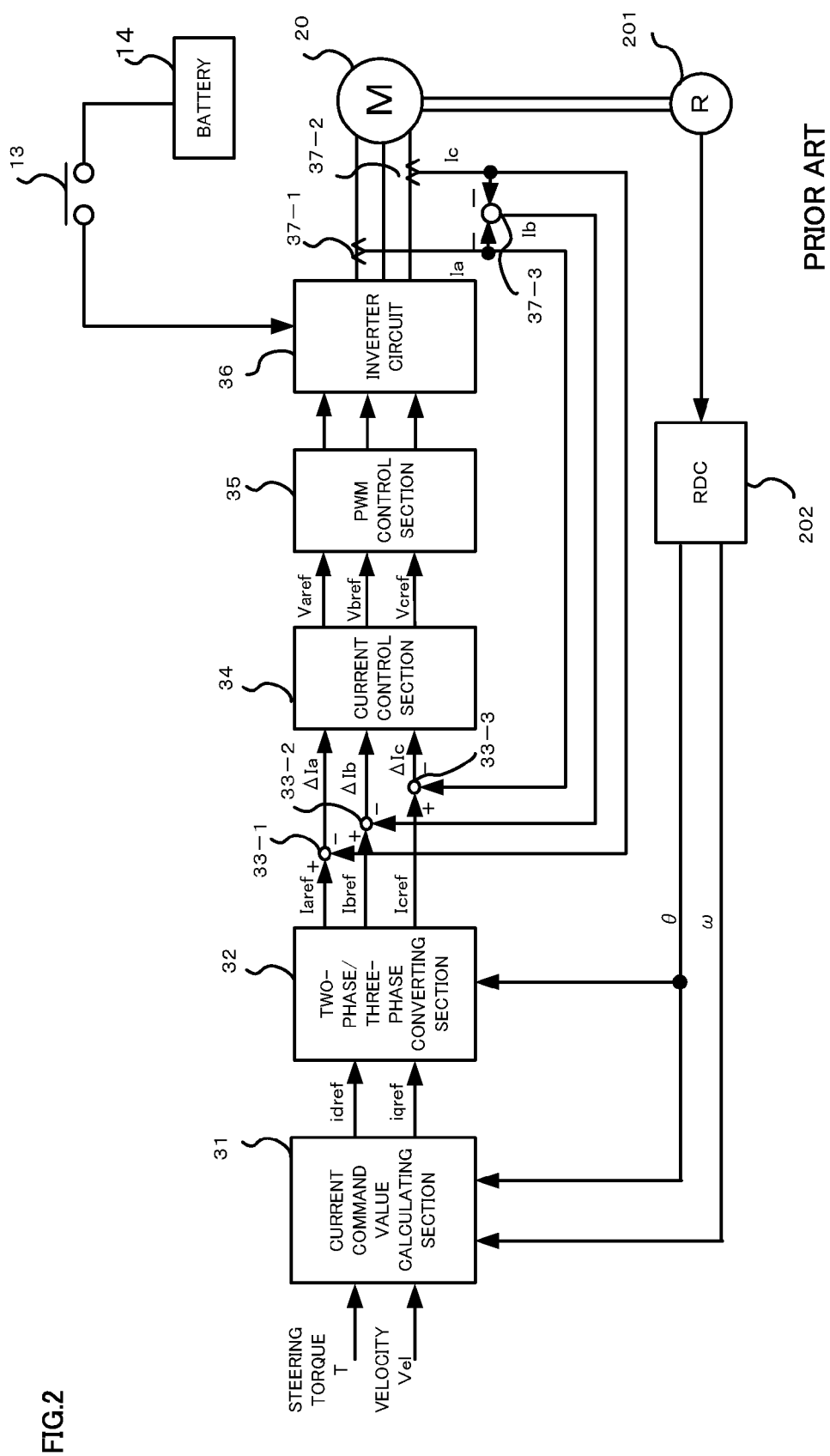
FIG. 2 is a block diagram showing a general configuration example of a control unit.

Since an electric power steering apparatus is an electrical control system that its electricity consumption is considerably high among electrical control systems of a vehicle, in diagnosing a state of a battery as a power supply that is supplied to plural electrical control systems, the present invention uses that whether it is possible to supply a voltage capable of maintaining normal operations of the electric power steering apparatus or not as a diagnostic reference of the battery state. That is, as shown in FIG. 2, it is thought to diagnose the state of the battery 14 based on a supply voltage that is supplied to the inverter circuit 36 from the battery 14 through the power relay 13. Hereinafter, the present invention will be described in the case of using a battery as a power supply.

A battery state diagnosis method according to the present invention starts a battery state diagnosis at the time that the ignition key is switched from "OFF" to "ON" or at the time that the ignition key is switched from "ON" to "OFF", and stores a value obtained by adding an offset to an angle θ of the motor 20 that is read at the time as a pseudo-motor-angle.

Then, although passing the motor current during the diagnosis, the present invention performs the state diagnosis of the battery 14 based on the voltage supplied to the inverter circuit 36 and storing a diagnosis result while performing the vector control by using the stored pseudo-motor-angle as the angle θ of the motor 20 so as not to generate the motor torque.

Further, when the driver steers, in order not to give an uncomfortable feeling to the driver, at the start of the battery state diagnosis, in the case that the steering torque T detected by the torque sensor 10 or the angle θ of the motor 20 varies, the battery state diagnosis not started. Moreover, in the middle of the battery state diagnosis, in the case that the steering torque T or the angle θ of the motor 20 varies, the battery state diagnosis is interrupted.

Hereinafter, embodiments of the present invention will be described in detail with reference to the drawings.

(First Embodiment)

Figure 3:
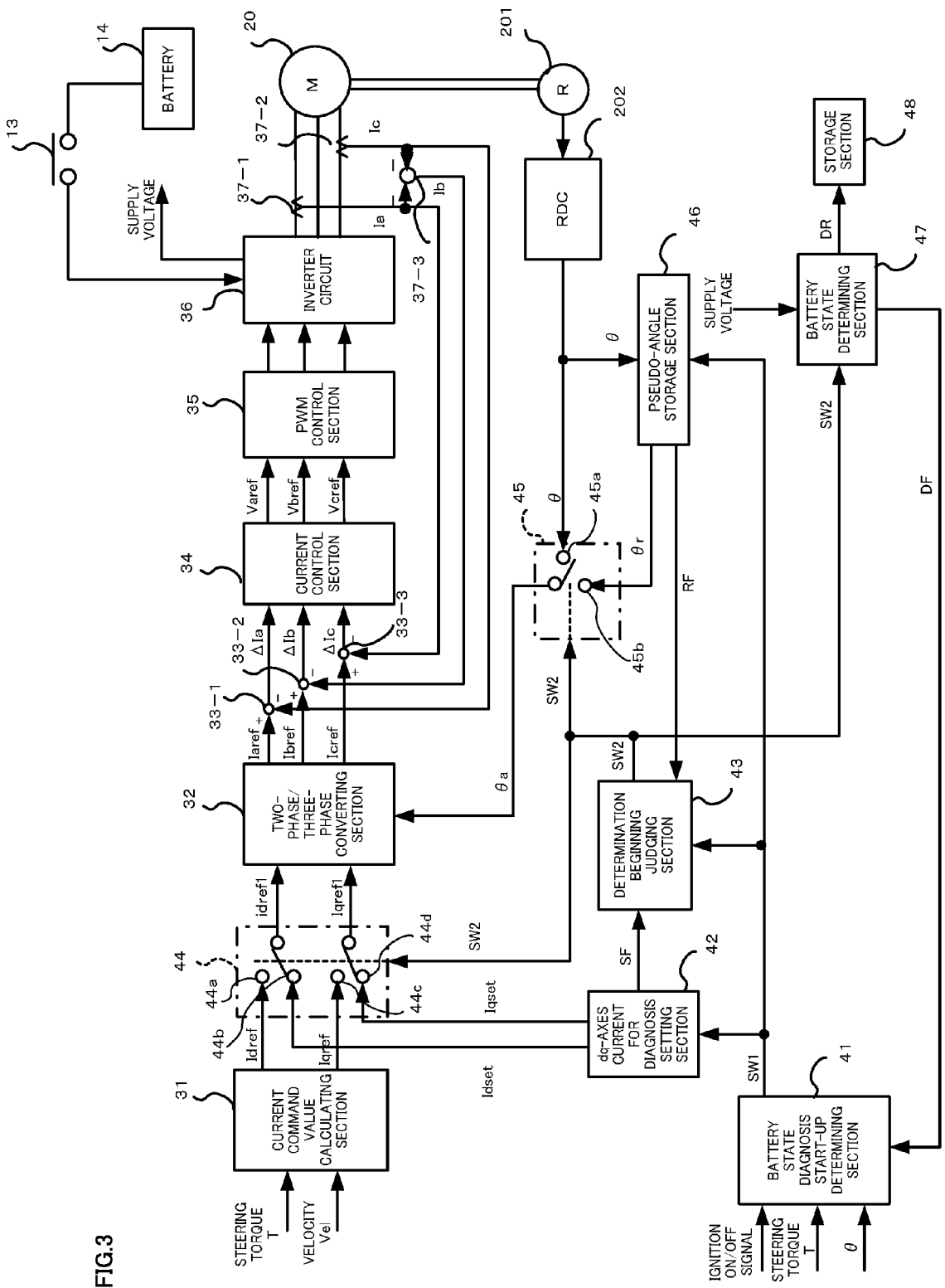
FIG. 3 is a block diagram showing a configuration example of a battery state diagnosis apparatus according to the first embodiment of the present invention.

FIG. 3 is a block diagram showing a configuration of a battery state diagnosis apparatus according to the first embodiment of the present invention, the portion of the electric power steering apparatus is shown as corresponding to FIG. 2, with respect to identical configurations, identical reference numerals are given without adding explanations.

In order to diagnose the state of the battery 14, a battery state diagnosis start-up determining section 41, a dq-axes current for diagnosis setting section 42, a determination beginning judging section 43, a switching section 44, a switching section 45, a pseudo-angle storage section 46, a battery state determining section 47 and a storage section 48 are provided.

The battery state diagnosis start-up determining section 41 inputs an ON/OFF signal of the power relay that operates in accordance with the ignition key 11, the steering torque T detected by the torque sensor 10 and the motor angle θ that is detected by the resolver 201 and converted by the resolver-to-digital converting circuit 202, and judges whether should start up a battery state diagnosis routine or not. Then, the battery state diagnosis start-up determining section 41 inputs a diagnosis start-up signal SW1 that is a judgment result to the dq-axes current for diagnosis setting section 42, the determination beginning judging section 43 and the switching section 45, a pseudo-angle storage section 46. In the case that "ΔT<α" and "Δθ<β" hold (where, "ΔT" is a variation (a difference) between a steering torque T that is read at the time that the ignition key is switched from "OFF" to "ON" or at the time that the ignition key is switched from "ON" to "OFF" and a steering torque T that is read at previous time, "α" is a given value, "Δθ" is a variation (a difference) between a motor angle θ that is read at this time and a motor angle θ that is read at previous time, and "β" is a given value), the battery state diagnosis start-up determining section 41 sets the diagnosis start-up signal SW1 as "ON". On the other hand, in the case that "ΔT≥α" holds or "Δθ≥β" holds, the battery state diagnosis start-up determining section 41 sets the diagnosis start-up signal SW1 as "OFF".

The dq-axes current for diagnosis setting section 42 inputs the diagnosis start-up signal SW1, when the diagnosis start-up signal SW1 becomes "ON", sets a d-axis current Idset and a q-axis current Iqset that are current command values for diagnosis and inputs them to the switching section 44, and simultaneously inputs a setting completion flag SF to the determination beginning judging section 43. Although it is good to set the current command values for diagnosis Idset and Iqset as fixed values, it is also good to increase the values Idset and Iqset with respect to each given time. However, since there is a possibility to cause an unexpected motor torque variation due to an abrupt variation in the current of the motor 20, it is preferred that the current of the motor 20 does not vary abruptly.

The determination beginning judging section 43 inputs a pseudo-motor-angle storing completion flag RF, the setting completion flag SF and the diagnosis start-up signal SW1, when all of the above-mentioned three signals are "ON", sets a diagnosis beginning signal SW2 as "ON" and inputs it to the switching section 44, the switching section 45 and the battery state determining section 47. Here, when the diagnosis beginning signal SW2 is "ON", it means that the battery state determination starts, and when the diagnosis beginning signal SW2 is "OFF", it means that the battery state determination finishes and returning to the ordinary assist control.

The switching section 44 inputs the dq-axes current command values (Idref and Iqref) that are calculated based on the steering torque T and the velocity Vel by the current command value calculating section 31, the current command values for diagnosis (Idset and Iqset) that are set by the dq-axes current for diagnosis setting section 42 and the diagnosis beginning signal SW2. When the diagnosis beginning signal SW2 is "OFF", contacts of the switching section 44 are switched to contacts 44a and 44c, the dq-axes current command values (Idref and Iqref) calculated by the current command value calculating section 31 inputted to the two-phase/three-phase converting section 32, and the ordinary assist control is performed. On the other hand, when the diagnosis beginning signal SW2 is "ON", the contacts of the switching section 44 are switched to contacts 44b and 44d, the current command values for diagnosis (Idset and Iqset) are inputted to the two-phase/three-phase converting section 32, and the battery state diagnosis is performed.

The switching section 45 inputs a pseudo-motor-angle θr that is stored in the pseudo-angle storage section 46 and the motor angle θ that is detected by the resolver 201 and converted by the resolver-to-digital converting circuit 202 and is switched in accordance with the diagnosis beginning signal SW2, and one of them is inputted to the two-phase/three-phase converting section 32 as a motor angle θa. In other words, when the diagnosis beginning signal SW2 is "OFF", the switching section 45 is switched to the contact 45a, the detected motor angle θ is inputted to the two-phase/three-phase converting section 32 as the motor angle θa, and the ordinary assist control is performed. When the diagnosis beginning signal SW2 is "ON", the switching section 45 is switched to the contact 45b, the pseudo-motor-angle θr that is stored at the time of starting the battery state diagnosis is inputted to the two-phase/three-phase converting section 32 as the motor angle θa, and the battery state diagnosis is performed.

The pseudo-angle storage section 46 inputs the diagnosis start-up signal SW1 and the detected motor angle θ. When the diagnosis start-up signal SW1 is "ON", the pseudo-angle storage section 46 stores a value obtained by adding the offset to a motor angle θ at that time as a pseudo-motor-angle θr, sets the pseudo-motor-angle storing completion flag RF as "ON" and inputs the pseudo-motor-angle storing completion flag RF to the determination beginning judging section 43, and simultaneously inputs the pseudo-motor-angle θr to the switching section 45. In the present invention, the pseudo-motor-angle θr is used so as not to generate the motor torque although the motor current is passed during the diagnosis.

Figure 4:
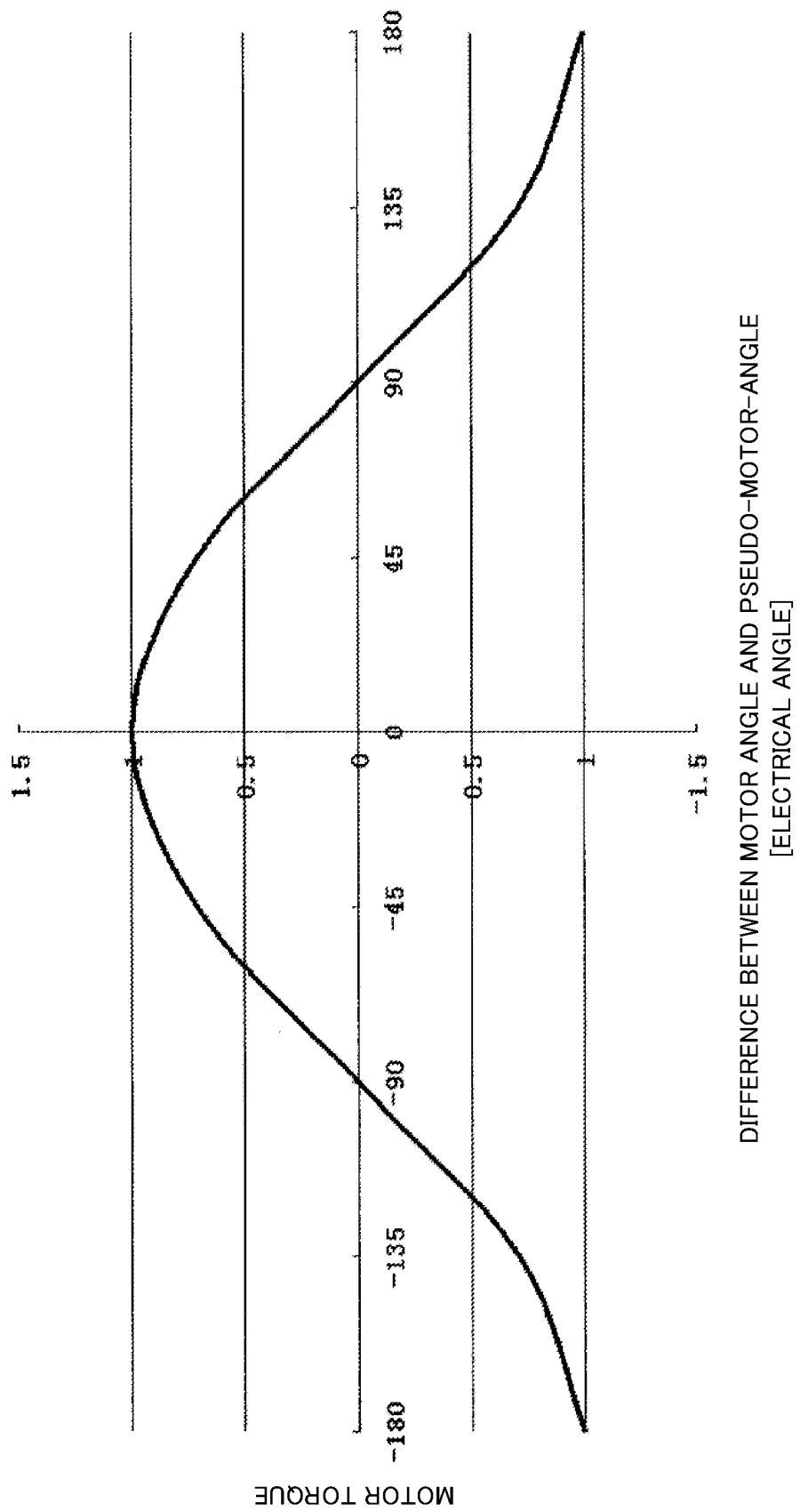
FIG. 4 is a characteristic diagram showing a relation between the torque of the motor and a difference between the motor angle and the pseudo-motor-angle in the first embodiment of the present invention.

FIG. 4 is a characteristic diagram showing a relation between the torque generated by the motor 20 and a difference between the motor angle θ and the pseudo-motor-angle θr in the case of passing the current only through the q-axis. As shown in FIG. 4, in the motor 20 according to this embodiment, when the difference between the pseudo-motor-angle θr and the motor angle θ is 90-degree, the torque generated by the motor 20 is zero and becomes a state that the motor does not rotate.

Therefore, if storing a value obtained by adding an offset that is 90-degree to the detected motor angle θ as the pseudo-motor-angle θr, and inputting the stored pseudo-motor-angle θr to the two-phase/three-phase converting section 32 during the diagnosis, it is possible to fixate the motor 20. Further, since the offset for stabilizing the motor 20 varies in accordance with phases of the d-axis current and the q-axis current, the pseudo-angle storage section 46 varies the offset in accordance with the phases of the d-axis current and the q-axis current that will be passed.

The battery state determining section 47 inputs the supply voltage that is supplied to the inverter circuit 36 from the battery 14 through the power relay 13 and the diagnosis beginning signal SW2. When the diagnosis beginning signal SW2 is "ON", the battery state determining section 47 determines the state of the battery 14 based on the supply voltage, after a given time passes, transmits a determination result DR to the storage section 48, and sets a determining completion flag DF as "ON". Here, as a battery state determining method based on the supply voltage, a method that determines degradation level of the battery by comparing the supply voltage with at least one given threshold is used.

The storage section 48 stores the determination result DR from the battery state determining section 47. Based on the determination result DR stored in the storage section 48, it is possible that the control system of the vehicle informs the driver about the degradation of the battery 14 and prompts charging or exchanging of the battery. Therefore, it is possible to avoid failures of the vehicle due to the degradation of the battery.

Figure 5:
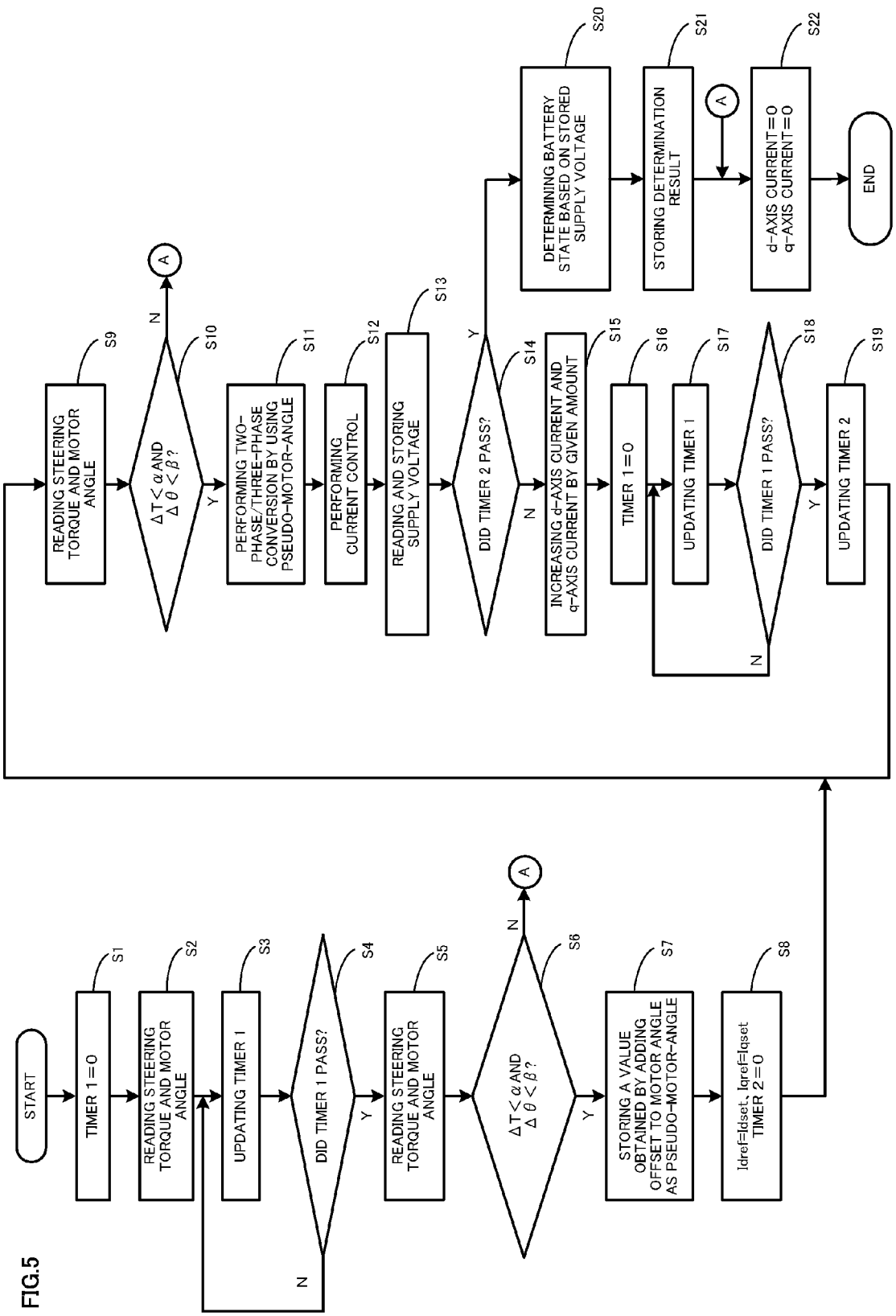
FIG. 5 is a flowchart representing a battery state diagnosis routine according to the first embodiment of the present invention.

In such a configuration as described above, the operation example will be described with reference to a flowchart shown in FIG. 5.

At the time that the ignition key is switched from "ON" to "OFF" or at the time that the ignition key is switched from "OFF" to "ON", the battery state diagnosis routine is started up. At first, the battery state diagnosis start-up determining section 41 sets a timer 1 as "0" (Step S1), reads the steering torque T detected by the torque sensor 10 and the motor angle θ that is detected by the resolver 201 and converted by the resolver-to-digital converting circuit 202 (Step S2), and updates the timer 1 (Step S3). Then, the timer 1 judges whether a given time t1 passes or not (Step S4). Returning to the Step S3 and updating the timer 1 until the given time t1 passes, when the given time t1 passes, the battery state diagnosis start-up determining section 41 reads the steering torque T and the motor angle θ at that time (Step S5), compares the steering torque T and the motor angle θ at the time that the timer 1 is set with the steering torque T and the motor angle θ at the time that the given time t1 passes, and judges that whether the variation ΔT in the steering torque T is smaller than the given value α or not and whether the variation Δθ in the motor angle θ is smaller than the given value β or not (Step S6). In the case that the variation ΔT in the steering torque T is more than or equal to the given value α or the variation Δθ in the motor angle θ is more than or equal to the given value β, the process skips to the Step S22, the d-axis current for diagnosis Idset is set to "0" and the q-axis current for diagnosis Iqset is also set to "0".

In the case that the variation ΔT in the steering torque T is smaller than the given value α and the variation Δθ in the motor angle θ is smaller than the given value β, the battery state diagnosis start-up determining section 41 sets the diagnosis start-up signal SW1 as "ON", the pseudo-angle storage section 46 inputs the diagnosis start-up signal SW1 that is "ON", stores a value obtained by adding the offset to a motor angle θ at that time as the pseudo-motor-angle θr, sets the pseudo-motor-angle storing completion flag RF as "ON" and inputs to the determination beginning judging section 43 (Step S7). The dq-axes current for diagnosis setting section 42 inputs the diagnosis start-up signal SW1 that is "ON", sets the d-axis current for diagnosis Idset and the q-axis current for diagnosis Iqset, sets the setting completion flag SF as "ON" and simultaneously sets a timer 2 as "0", and the determination beginning judging section 43 outputs the diagnosis beginning signal SW2 that is "ON" (Step S8).

Subsequently, the battery state diagnosis start-up determining section 41 reads the steering torque T and the motor angle θ at this time (Step S9), compares the steering torque T and the motor angle θ that are read at this time with the steering torque T and the motor angle θ that are read at a previous time, and judges that whether the variation ΔT in the steering torque T is smaller than the given value α or not and whether the variation Δθ in the motor angle θ is smaller than the given value β or not (Step S10). In the case that the variation ΔT in the steering torque T is more than or equal to the given value α or the variation Δθ in the motor angle θ is more than or equal to the given value β, the process skips to the above Step S22.

In the case that the variation ΔT in the steering torque T is smaller than the given value α and the variation Δθ in the motor angle θ is smaller than the given value β, in accordance with the diagnosis beginning signal SW2 that is "ON", the switching section 44 is switched from the contacts 44a and 44c to the contacts 44b and 44d and inputs the d-axis current for diagnosis Idset and the q-axis current for diagnosis Iqset to the two-phase/three-phase converting section 32 as the current command values Idref1 and Iqref1, and simultaneously the switching section 45 is switched from the contact 45a to the contact 45b. The pseudo-motor-angle θr stored in the pseudo-angle storage section 46 is inputted to the two-phase/three-phase converting section 32 as the motor angle θa, the two-phase/three-phase converting section 32 calculates the current command values of three phases Iaref, Ibref and Icref based on the d-axis current for diagnosis Idset, the q-axis current for diagnosis Iqset and the pseudo-motor-angle θr (Step S11). A subtracting section 33-1 calculates a deviation between the calculated current command value Iaref and the detected motor current Ia, a subtracting section 33-2 calculates a deviation between the calculated current command value Ibref and the detected motor current Ib, a subtracting section 33-3 calculates a deviation between the calculated current command value Icref and the detected motor current Ic, the current control section 34 performs a feedback current control based on these calculated deviations and drives the motor 20 through the PWM control section 35 and the inverter circuit 36 (Step S12). The battery state determining section 47 reads and stores the supply voltage that is supplied to the motor 20 from the battery 14 through the inverter circuit 36 (Step S13). The timer 2 judges whether a given time t2 passes or not (Step S14), when the given time t2 does not pass, the d-axis current for diagnosis Idset and the q-axis current for diagnosis Iqset are increased by a given amount (Step S15), the timer 1 is set to "0" (Step S16), and the timer 1 is updated (Step S17). Then, the timer 1 judges whether the given time t1 passes or not (Step S18), when the given time t1 does not pass, the process returns to the above Step S17. When the given time t1 passes, the timer 2 is updated and returns to the above Step S9 (Step S19).

At the Step S14, when the timer 2 judges that the given time t2 passes, the battery state determining section 47 determines the state of the battery 14 based on the stored supply voltage (Step S20), transmits the determination result DR to the storage section 48 to store, and simultaneously sets the determining completion flag DF as "ON" and inputs to the battery state diagnosis start-up determining section 41 (Step S21).

At the above Step S22, the d-axis current for diagnosis Idset and the q-axis current for diagnosis Iqset are set to "0", each flag, the diagnosis start-up signal SW1 and the diagnosis beginning signal SW2 are sets to "OFF", and the battery state diagnosis routine is ended.

(Second Embodiment)

Figure 6:
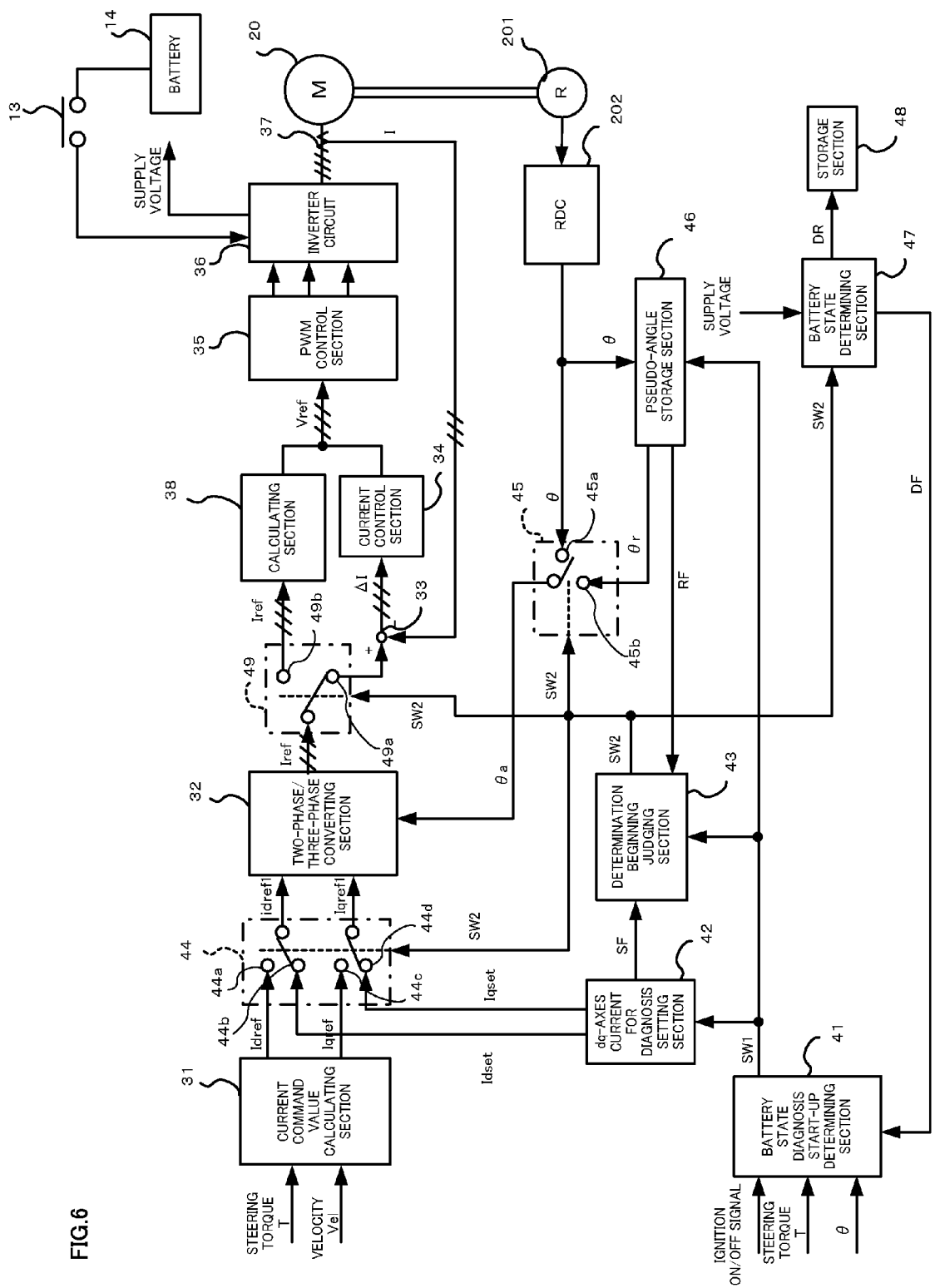
FIG. 6 is a block diagram showing a configuration example of a battery state diagnosis apparatus according to the second embodiment of the present invention.

FIG. 6 shows a configuration of a battery state diagnosis apparatus according to the second embodiment of the present invention as corresponding to FIG. 3, with respect to identical configurations, identical reference numerals are given without adding explanations.

In this embodiment, in order to diagnose the state of the battery 14, as the first embodiment, a battery state diagnosis start-up determining section 41, a dq-axes current for diagnosis setting section 42, a determination beginning judging section 43, a switching section 44, a switching section 45, a pseudo-angle storage section 46, a battery state determining section 47 and a storage section 48 are provided. Moreover, a calculating section 38 and a switching section 49 are further provided.

In the first embodiment, even during the diagnosis, by means of the current control section 34 that is a feedback control, the subtracting sections 33-1, 33-2 and 33-3, making the deviation between the current command value Iaref and the detected motor current Ia, the deviation between the current command value Ibref and the detected motor current Ib and the deviation between the current command value Icref and the detected motor current Ic small. However, during the diagnosis, since the motor 20 is fixated by using the pseudo-motor-angle θr, it is not necessary to perform the feedback control.

As shown in FIG. 6, in order to perform an open-loop control during the diagnosis, the calculating section 38 is provided in the second embodiment. The calculating section 38 uses resistance components of the inverter circuit 36 and the motor 20 as parameters, and obtains the voltage command value Vref based on the current command value Iref.

The switching section 49 inputs the current command value Iref and the diagnosis beginning signal SW2. When the diagnosis beginning signal SW2 is "OFF", the contact of the switching section 49 is switched to a contact 49a, the feedback control is performed by means of the current control section 34 and the subtracting section 33. On the other hand, when the diagnosis beginning signal SW2 is "ON", the contact of the switching section 49 is switched to a contact 49b, the open-loop control is performed by means of the calculating section 38.

In such a configuration as described above, since when providing the ordinary assist force, the feedback control is performed, and when diagnosing the state of the battery 14, the open-loop control with small calculation amount is performed, the calculation amount during the battery state diagnosis becomes small, and it is possible to make the capacity of control programs small. Moreover, since separating the control at the normal time and the control at the time of diagnosis to manage and implement, it is also possible to reduce the program capacity as the whole.

(Third Embodiment)

Figure 7:
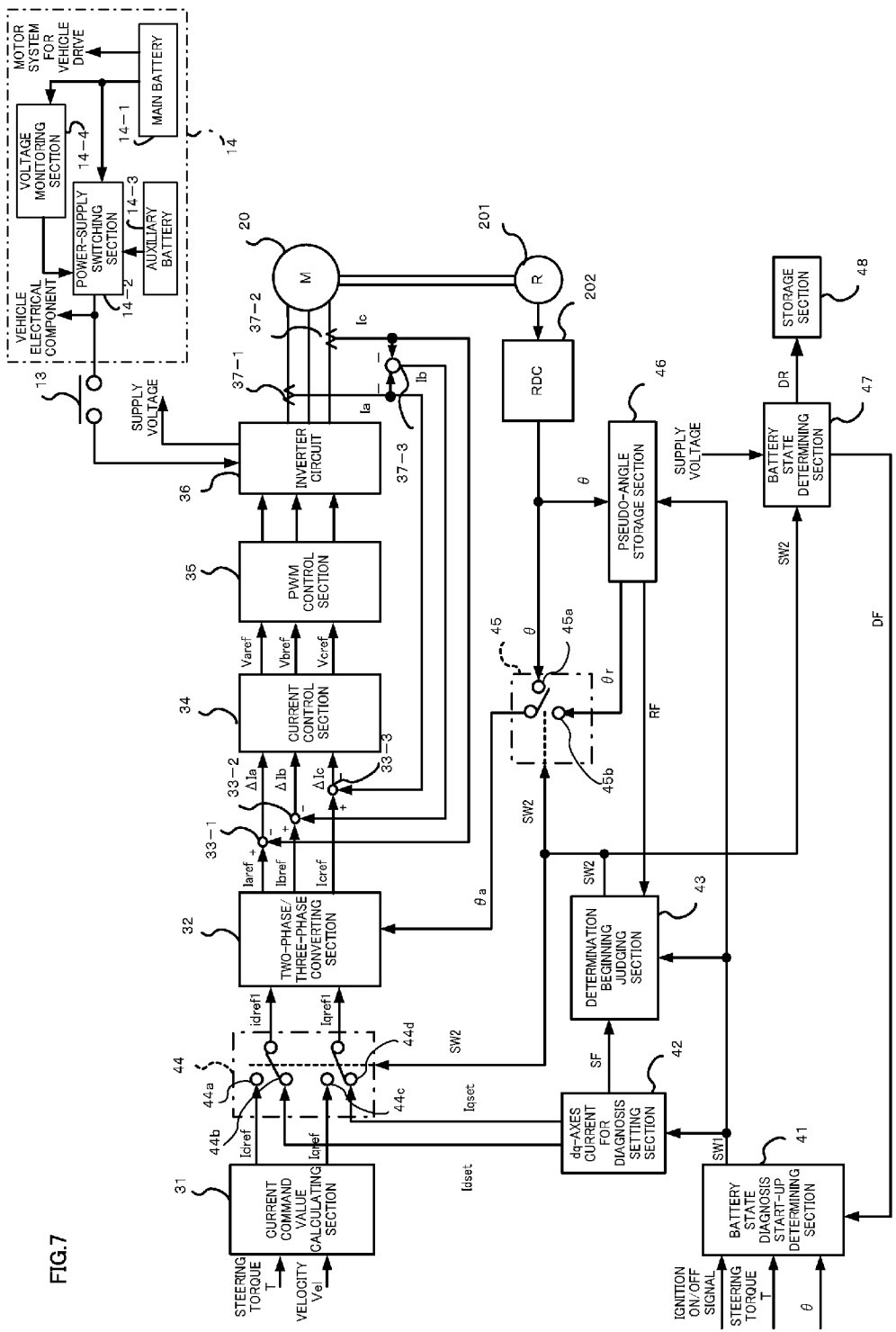
FIG. 7 is a block diagram showing a configuration example of a battery state diagnosis apparatus according to the third embodiment of the present invention.

FIG. 7 is a block diagram that is obtained by changing the battery 14 of the block diagram of FIG. 3 that shows one configuration of the battery state diagnosis apparatus according to the first embodiment, parts differing from the first embodiment will be described. A battery 14 of the third embodiment shows an example of battery configurations equipped with electrical vehicles. The battery 14 has a main battery 14-1 and an auxiliary battery 14-3, the voltage of the main battery 14-1 is monitored by a voltage monitoring section 14-4. The battery 14 has a power-supply configuration that at the normal time, the power supply is supplied from the main battery 14-1 through a power-supply switching section 14-2, and at the time that the voltage monitoring section 14-4 detects abnormalities or failures in the voltage of the main battery 14-1, the power supply is supplied from the auxiliary battery 14-3 by switching the power-supply switching section 14-2. That is, a power-supply configuration with plural power supplies that switches to the auxiliary battery 14-3 at the abnormal time of the main battery 14-1 to make the backup possible. Here, in general, there is such the main battery 14-1 that has a configuration further divided into multiple parts.

In the normal state, although the main battery 14-1 drives a motor system for vehicle drive, vehicle electrical components and an electric power steering apparatus, at the time of switching to the auxiliary battery 14-3 in accordance with the abnormalities in the voltage of the main battery 14-1, only the vehicle electrical components and the electric power steering apparatus can be driven. Therefore, at the normal time, in a state that abnormalities in the auxiliary battery 14-3 occurring, by switching to the auxiliary battery 14-3 in accordance with the abnormalities in the voltage of the main battery 14-1, since the vehicle electrical components and the electric power steering apparatus can not operate, it is necessary to constantly or periodically perform the battery state diagnosis of the above-described first embodiment even with respect to the voltage of the auxiliary battery 14-3.

(Fourth Embodiment)

Figure 8:
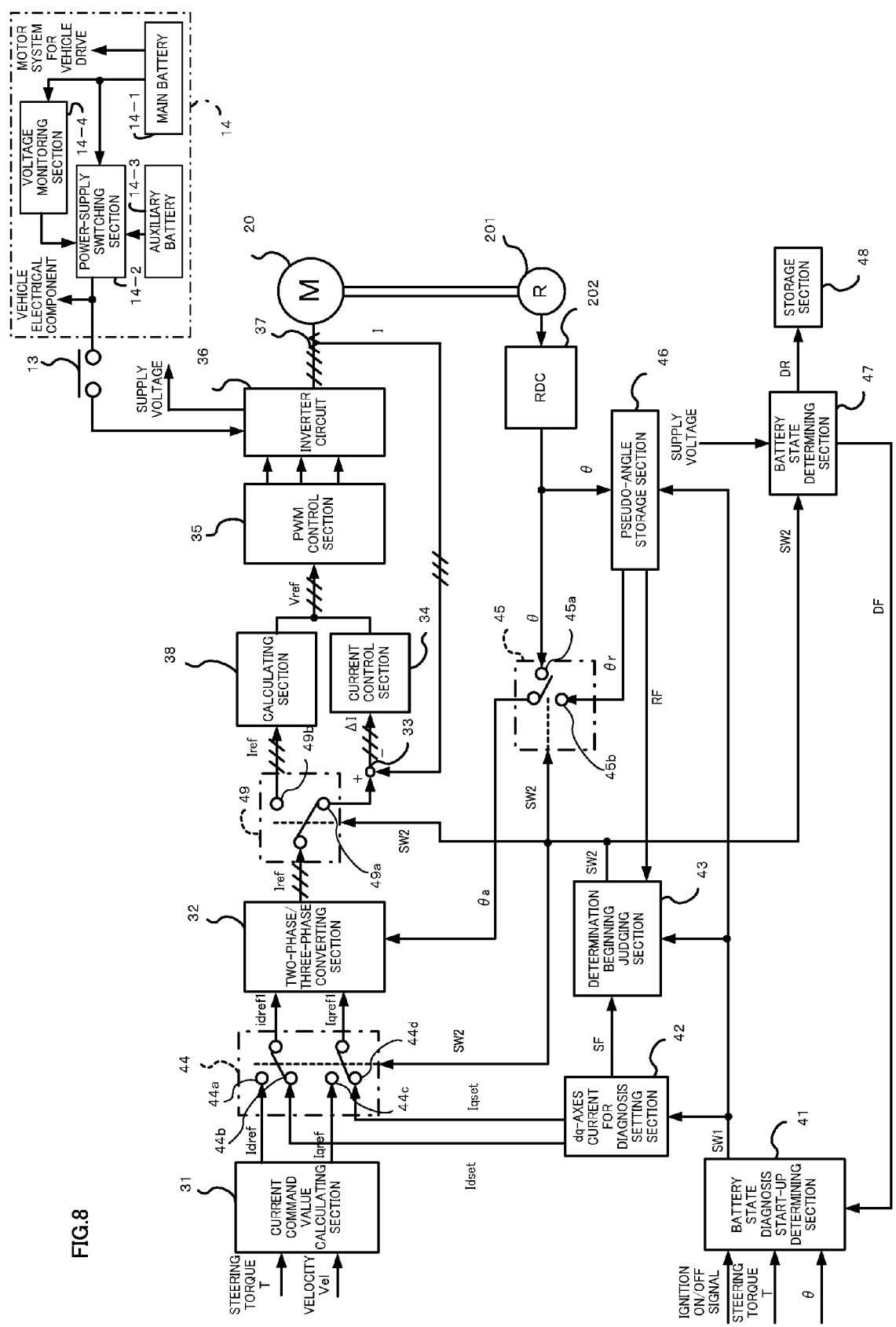
FIG. 8 is a block diagram showing a configuration example of a battery state diagnosis apparatus according to the fourth embodiment of the present invention.

FIG. 8 is a block diagram that is obtained by changing the battery 14 of the block diagram of FIG. 6 that shows one configuration of the battery state diagnosis apparatus according to the second embodiment by a method same as FIG. 7 (the third embodiment). In the fourth embodiment, in the normal state, although the main battery 14-1 drives a motor system for vehicle drive, vehicle electrical components and an electric power steering apparatus, at the time of switching to the auxiliary battery 14-3 in accordance with the abnormalities in the voltage of the main battery 14-1, only the vehicle electrical components and the electric power steering apparatus can be driven. Therefore, at the normal time, in a state that abnormalities in the auxiliary battery 14-3 occurring, by switching to the auxiliary battery 14-3 in accordance with the abnormalities in the voltage of the main battery 14-1, since the vehicle electrical components and the electric power steering apparatus can not operate, it is necessary to constantly or periodically perform the battery state diagnosis of the above-described second embodiment even with respect to the voltage of the auxiliary battery 14-3.

Moreover, in the above-described embodiments (i.e. the first embodiment, the second embodiment, the third embodiment and the fourth embodiment), although passing the motor current, a value obtained by adding the offset to a motor angle $\theta$ at the time of starting the battery state diagnosis is stored as the pseudo-motor-angle $\theta r$, and the pseudo-motor-angle $\theta r$ is inputted to the current command value calculating section 31 and the two-phase/three-phase converting section 32 as the motor angle $\theta a$ so as not to generate the motor torque, instead of the motor angle $\theta$, it is also possible to use steering angle information.

EXPLANATION OF REFERENCE NUMERALS

10 torque sensor
20 ignition key
12 velocity sensor
13 power relay
14 battery
20 motor
201 resolver
202 resolver-to-digital converting circuit
31 current command value calculating section
32 two-phase/three-phase converting section
34 current control section
35 PWM control section
36 inverter
38 calculating section
41 battery state diagnosis start-up determining section
42 dq-axes current for diagnosis setting section
43 determination beginning judging section
44,45 switching section
46 pseudo-angle storage section
47 battery state determining section
48 storage section

The invention claimed is:

1. A power state diagnosis method that diagnoses a power state of a vehicle which comprises an electrical control system supplied from a power supply and a motor controlled by a vector control method, comprising:
   starting a diagnosis of said power state at a time that an ignition key is switched from "OFF" to "ON" or at a time that said ignition key is switched from "ON" to "OFF",
   storing a value obtained by adding an offset to an angle of said motor that is read at a start of said diagnosis as a pseudo-motor-angle,
   performing said vector control based on said pseudo-motor-angle during said diagnosis, and
   diagnosing said power state based on a voltage that is supplied to said motor.

2. A power state diagnosis method according to claim 1, wherein said electrical control system is an electric power steering apparatus that drives said motor based on a current command value calculated from at least a steering torque detected by a torque sensor.

3. A power state diagnosis method according to claim 2, wherein before starting said diagnosis, in a case that said steering torque or said motor angle varies due to operations of a driver, said power state is not diagnosed.

4. A power state diagnosis method according to claim 2, wherein in the middle of said diagnosis, in a case that said steering torque or said motor angle varies due to operations of said driver, said diagnosis of said power state is interrupted.

5. A power state diagnosis method according to claim 1, wherein in a middle of said diagnosis, in a case that said steering torque or said motor angle varies due to operations of said driver, said diagnosis of said power state is interrupted.

6. A power state diagnosis method according to claim 1, wherein said diagnosis is performed at the time that said ignition key is switched from "OFF" to "ON", said driver is informed about a determination that said power state degrades.

7. A power state diagnosis method according to claim 1, wherein said diagnosis is performed at a time that said ignition key is switched from "ON" to "OFF",
   in a case of determining that said power state degrades, a determination result is stored, when said ignition key is switched from "OFF" to "ON" in a next time, said driver is informed about said determination result.

8. A power state diagnosis method according to claim 1, wherein said motor is a brushless DC motor.

9. A power state diagnosis method according to claim 1, wherein said motor is controlled by an open-loop during said diagnosis.

10. A power state diagnosis apparatus that is equipped with a vehicle which comprises a power supply supplied to plural electrical control systems and a motor that is supplied from said power supply and controlled by a vector control method and diagnoses a state of said power supply, comprising:
 a power state diagnosis start-up determining section for detecting that an ignition key is switched from "OFF" to "ON" and said ignition key is switched from "ON" to "OFF" and starting a state diagnosis of said power supply,
 a pseudo-motor-angle storage section for storing a value obtained by adding an offset to an angle of said motor at the start of said diagnosis as a pseudo-motor-angle,
 a switching section for switching said motor angle to said pseudo-motor-angle during said diagnosis, and
 a power state determining section for diagnosing said state of said power supply based on a voltage that is supplied to said motor.

11. A power state diagnosis apparatus according to claim 10, wherein said electrical control system is an electric power steering apparatus that drives said motor based on a current command value calculated from at least a steering torque detected by a torque sensor.

12. A power state diagnosis apparatus according to claim 11, wherein before starting said diagnosis, in a case that said steering torque or said motor angle varies due to operations of a driver, said state of said power supply is not diagnosed.

13. A power state diagnosis apparatus according to claim 11, wherein in the middle of said diagnosis, in a case that said steering torque or said motor angle varies due to operations of said driver, said state diagnosis of said power supply is interrupted.

14. A power state diagnosis apparatus according to claim 12, wherein in a middle of said diagnosis, in a case that said steering torque or said motor angle varies due to operations of said driver, said state diagnosis of said power supply is interrupted.

15. A power state diagnosis apparatus according to claim 10, wherein said motor is controlled by an open-loop during said diagnosis.

16. A power state diagnosis apparatus according to claim 11, wherein said motor is controlled by an open-loop during said diagnosis.

17. A power state diagnosis apparatus according to claim 12, wherein said motor is controlled by an open-loop during said diagnosis.

* * * * *